(12) United States Patent
Ju

(10) Patent No.: US 6,562,676 B1
(45) Date of Patent: May 13, 2003

(54) METHOD OF FORMING DIFFERENTIAL SPACERS FOR INDIVIDUAL OPTIMIZATION OF N-CHANNEL AND P-CHANNEL TRANSISTORS

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/014,426

(22) Filed: Dec. 14, 2001

(51) Int. Cl.$^7$ .......................................... H01L 21/8238
(52) U.S. Cl. ..................... 438/232; 438/303; 438/595; 438/652
(58) Field of Search ................................ 438/230–232, 438/229, 303–305, 595, 289, 299, 652, 22; 257/408, 344, 330

(56) References Cited

U.S. PATENT DOCUMENTS 5,981,325 A * 11/1999 Hung ........................ 438/224

2002/0090771 A1 * 7/2002 Lin ............................ 438/163

* cited by examiner

Primary Examiner—Carl Whitehead, Jr.
Assistant Examiner—Yennhu B Huynh
(74) Attorney, Agent, or Firm—McDermott, Will & Emery

(57) ABSTRACT

A method of forming a semiconductor with n-channel and p-channel transistors with optimum gate to drain overlap capacitances for each of the different types of transistors, uses differential spacing on gate electrodes for the respective transistors. A first offset spacer is formed on the gate electrode and an n-channel extension implant is performed to create source/drain extensions for the n-channel transistors spaced an optimum distance away from the gate electrodes. Second offset spacers are formed on the first offset spacers, and a p-channel source/drain extension implant is formed to create source/drain extensions for the p-channel transistors. The increased spacing of the source/drain extension implants away from the gate electrodes in the p-channel transistors accounts for the faster diffusion of the p-type dopants in comparison to the n-type dopants.

5 Claims, 3 Drawing Sheets

METHOD OF FORMING DIFFERENTIAL SPACERS FOR INDIVIDUAL OPTIMIZATION OF N-CHANNEL AND P-CHANNEL TRANSISTORS

FIELD OF THE INVENTION

The present invention relates to the field of semiconductor manufacturing, and more particularly, to the formation of n-channel and p-channel transistors with reduced gate overlap capacitance.

BACKGROUND OF THE INVENTION

Fabrication of a semiconductor device and an integrated circuit thereof begins with a semiconductor substrate and employs film formation, ion implantation, photolithographic, etching and deposition techniques to form various structural features in or on a semiconductor substrate to attain individual circuit components which are then interconnected to ultimately form an integrated semiconductor device. Escalating requirements for high densification and performance associated with ultra large-scale integration (ULSI) semiconductor devices requires smaller design features, increased transistor and circuit speed, high reliability and increased manufacturing throughput for competitiveness. As the devices and features shrink, and as the drive for higher performing devices escalate, new problems are discovered that require new methods of fabrication or new arrangements or both.

There is a demand for large-scale and ultra large-scale integration devices employing high performance metal-oxide-semiconductor (MOS) devices. MOS devices typically comprise a pair of ion implanted source/drain regions in a semiconductor substrate and a channel region separating the source/drain regions. Above the channel region is typically a thin gate oxide and a conductive gate comprising conductive polysilicon or another conductive material. In a typical integrated circuit, there are a plurality of MOS device of different conductivity types, such as n-type and p-type, and complementary MOS (CMOS) devices both employing both p-channel and n-channel devices that are formed on a common substrate. CMOS technology offers advantages of significantly reduced power density and dissipation as well as reliability, circuit performance and cost advantages.

As the demand has increased for semiconductor chips that offer more functions per chip and shorter times for performing those functions, semiconductor device dimensions have been pushed deeper and deeper into the sub-micron regime. Smaller devices readily translate into more available area for packing more functional circuitry onto a single chip. Smaller devices are also inherently advantageous in terms of shorter switching times.

There are certain factors, such as parasitic device capacitance, that impact device switching times. One relevant component of parasitic device capacitance is the gate to drain overlap capacitance which is also referred to as "Miller Capacitance". The gate to drain overlap capacitance can have a significant impact on device switching speed. It is important to obtain sufficient gate overlap of source/drains for maintaining low channel resistance, but still minimize the gate to drain overlap capacitance. One of the methods that has been employed involves the use of offset spacers on the gate electrodes during source/drain extension implantation steps. The offset spacers act as a mask to prevent implantation of the dopants into the substrate directly beneath the spacers and thus, increases the separation between the source/drain extensions and the gate electrode.

The diffusivity in silicon of boron, a p-type dopant, is significantly greater than the diffusivity of arsenic, an n-type dopant. This creates a concern in semiconductor devices that contain both n-channel and p-channel transistors. The formation of an offset spacer that minimize the overlap capacitance will be optimized for only one type of transistor (e.g., n-channel) and not the other type of transistor (e.g., p-channel). In other words, providing an offset spacer with the optimum width to optimize the gate to drain overlap capacitance for an n-channel transistor will not provide the optimum spacing for a p-channel transistor optimization, due to the faster diffusion of boron in silicon.

SUMMARY OF THE INVENTION

There is a need for a method of producing n-channel and p-channel transistors on the same chip in a manner that allows optimization of the gate to drain overlap capacitance for each of the different types of transistors on the chip.

These and other needs are met by embodiments of the present invention which provide a method of forming n-channel and p-channel transistors on the same substrate, and comprises the steps of forming source/drain extensions in n-channel transistors by implanting n-type dopants a first distance away from first gate electrodes. Source/drain extensions are formed in the p-channel transistors by implanting p-type dopants a second distance away from second gate electrodes, the second distance being greater than the first distance.

By implanting the p-type dopants into the substrate a distance that is further away from the gate electrodes then the distance at which the n-type dopants are implanted, the faster diffusion of the p-type dopants is accommodated, thereby allowing optimization of the gate to drain overlap capacitance for both the n-channel transistors and the p-channel transistors. In certain embodiments of the invention, the n-type dopants are implanted in accordance with a first spacer width, and the p-type dopants are implanted in accordance with a second spacer width. In certain embodiments of the invention, the first spacer width is equal to the width of a first offset spacer on the gate electrode of the n-channel and p-channel transistors. The second spacer width is equal to the width of the first offset spacers plus the second offset spacers that are formed on the first offset spacers to form offset spacer pairs.

The other stated needs are also met by embodiments of the present invention which provide a method of forming a semiconductor device with a substrate and n-channel and p-channel transistors. This method comprises the steps of forming first offset spacers on gate electrodes on the n-channel and p-channel transistors. Source/drain extensions are implanted into the substrate at only the n-channel transistors, with the first offset spacers masking implantation into the substrate directly beneath the first offset spacers. Second offset spacers are formed on the first offset spacers. Source/drain extensions are then implanted into the substrate at only the p-channel transistors. The first and second offset spacers mask the implantation into the substrate directly beneath the first and second offset spacers.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the reduction of gate to drain overlap capacitance, and in particular to the problems caused by the differential diffusion rates of p-type dopants and n-type dopants in silicon. The present invention optimizes the overlap capacitance of n-channel transistors and p-channel transistors, respectively, by implanting the dopants of source/drain extensions at different spacing from the gate electrodes. This is accomplished by forming a first offset spacer on the gate electrode, and creating a source/drain extension implant in only the n-channel transistors. Second offset spacers are formed on the first offset spacers, and source/drain extension implants are created in the p-channel transistors. Hence, the source/drain extension implants in the p-channel transistors are spaced further from the gate electrode then the source/drain extensions in the n-channel transistors. This accounts for the faster diffusion of p-type dopants, such as boron. This permits the overlap capacitance to be optimized for both the n-channel and p-channel transistors.

Figure 1:
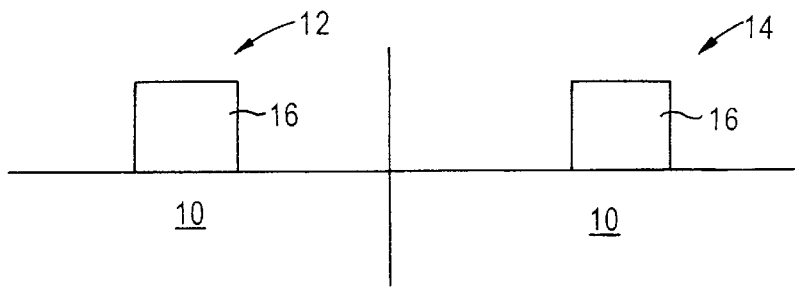
FIG. 1 is a cross-sectional, schematic depiction of n-channel and p-channel transistors on a semiconductor device, during one stage of manufacturing in accordance with embodiments of the present invention.

FIG. 1 depicts a cross-sectional, schematic depiction of one of the n-channel transistors and one of the p-channel transistors during one step of the manufacturing of the present invention. Except where otherwise noted, the following description employs conventional processing methodologies to form and etch the layers, and implant the dopants into the substrate. As shown in FIG. 1 a substrate 10 forms a common substrate for the n-channel and p-channel transistors. The n-channel transistor 12 has a gate electrode 16, as does the p-channel transistor 14. The gate electrodes 16 are formed in a conventional manner, as by deposition of polysilicon gate layer over the substrate 10, and conventional photolithographic and etching techniques.

Figure 2:
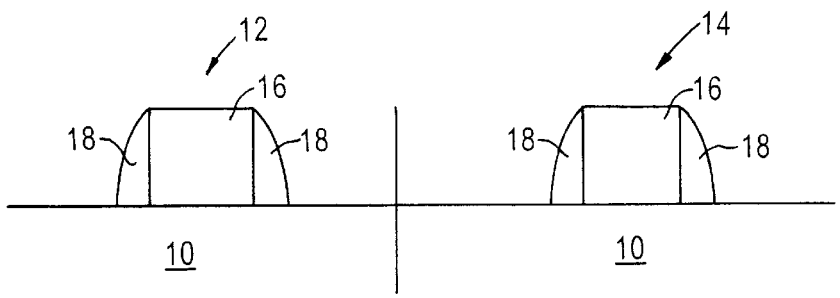
FIG. 2 shows the structure of FIG. 1 after the formation of a first offset spacer in accordance with embodiments of the present invention.

In FIG. 2, first offset spacers 18 are formed on all the gate electrodes 16, in both the p-channel 14 and n-channel 12 transistors. The first offset spacers 18 may be made of a conventional spacer material, such as silicon nitride or silicon oxide, for example, but other materials may also be used, such as silicon oxynitride, for example. The deposition and formation of the first offset spacer include deposition of a first spacer material in a first spacer layer (not shown) over the entire substrate 10 and the gate electrodes 16. The thickness of the first spacer layer may be selected so that the first offset spacers 18 have a desired width after etching to optimize the gate to drain overlap capacitance of the n-channel transistors. For example, the depth of the first spacer layer may be between about 100 Å to about 300 Å. After conventional anisotropic etching, such as a reactive ion etch, the first offset spacers 18 are formed with a width of between about 60 to about 180 Å wide on the substrate 10. This spacing is normally considered adequate for an offset spacer for n-channel transistors to provide the optimum gate to drain overlap capacitance. As can be seen from this example, the anisotropic etching produces a spacer 18 that has a width of approximately 60% of the thickness of the spacer layer. Greater or lesser thicknesses of the spacer layer, or variation in the etching techniques, may produce widths of offset spacers that are tailored to produce a desired overlap capacitance.

Figure 3:
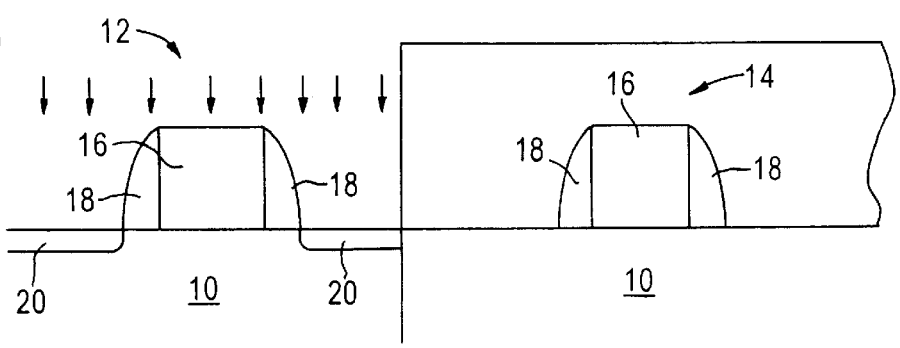
FIG. 3 depicts the structure of FIG. 2 following an extension implant into the n-channel devices to form a source/drain extension, in accordance with embodiments of the present invention.
Figure 4:
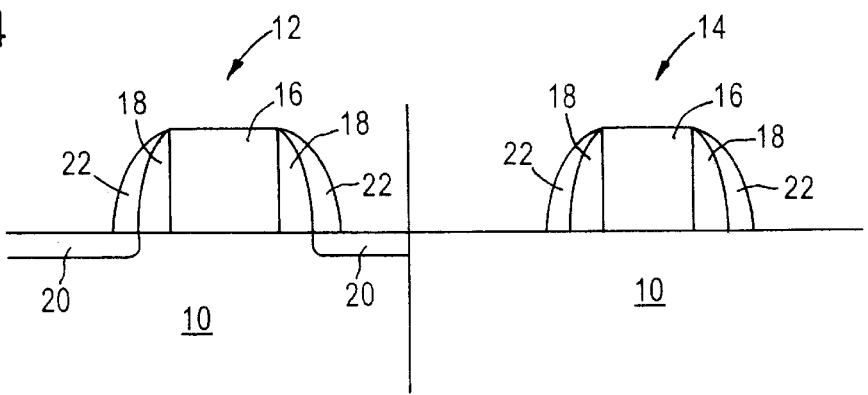
FIG. 4 shows the structure of FIG. 3 following the formation of a second offset spacer over the n-channel and the p-channel devices, in accordance with embodiments of the present invention.
Figure 5:
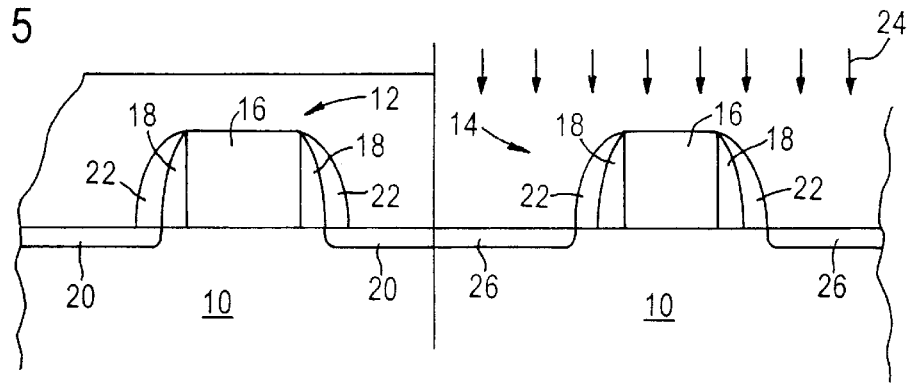
FIG. 5 depicts the structure of FIG. 4 following a p-channel source/drain extension implant, in accordance with embodiments of the present invention.

Following the formation of the first offset spacers 18, as depicted in FIG. 2, an n-channel source/drain extension implant is performed by conventional technique as depicted FIG. 3. The p-channel transistors 14 are masked during the implantation process to protect the p-channel transistors 14 from implantation of n-type dopants Ion implantation, for example, may be performed to implant n-type dopants, such as arsenic, into the substrate 10. The implanted dopants create source/drain extensions 20 for the n-channel transistors 12. The first offset spacers 18 mask the substrate 10 to prevent ion implantation of the n-type dopants directly beneath the first offset spacers 18 in the n-channel transistor 12. The width of the first offset spacers 18 is optimized for the n-channel transistors 12. A conventional dosage and energy for the n-channel transistor source/drain extension implant may be employed to create the source/drain extensions 20.

Following the source/drain extension implantation process, the mask over the p-channel transistors 14 is removed and a second spacer layer (not shown) is deposited over the substrate 10 and the n-channel transistors 12 and the p-channel 14 transistors. The second spacer layer is then etched in a conventional, anisotropic manner, to form second offset spacers 22 on the first offset spacers 18 of both the n-channel transistors 12 and the p-channel transistors 14. Again, a conventional spacer material, such as silicon nitride or silicon oxide, may be used to form the second offset spacers 22.

The thickness of the second spacer layer may be tailored such that the width of the second offset spacer 22 is optimized to account for the faster diffusivity in silicon of p-type dopants. In other words, after etching, the offset spacer pair 24, formed by the first offset spacer 18 and the second offset spacer 22, should have a width that is selected to optimize the gate to drain overlap capacitance of p-channel transistors, taking into account the faster diffusion of p-type dopants. In accordance with certain embodiments of the invention, the thickness of the second spacer layer is between about 200 to about 400 Å. This creates second offset spacers 22 having a width of between about 120 to about 240 Å. Hence, the combined width of an offset spacer pair is between about 180 to about 420 Å. In certain preferred embodiments the combined width of the offset spacers 24 is between about 180 to about 300 Å wide.

In certain embodiments of the invention, a liner oxide (not shown) of about 100 Å thick is formed over the substrate 10, the first offset spacers 18 and the gate electrode 16 prior to the deposition of the second spacer layer. The liner oxide may be deposited by LPCVD (low pressure chemical vapor deposition) or PECVD (plasma enhanced chemical vapor deposition), for example. The liner oxide is not depicted in the embodiments of FIGS. 1–8, but may be used to improve the overall quality of the transistors.

Following the formation of the second offset spacers 22, the n-channel transistors 12 are masked off and a source/drain extension implant step is performed to create source/drain extension regions 26 in the p-channel transistors 14. The offset spacer pairs 24, comprising the first offset spacers 18 and the second offset spacers 22, mask the substrate 10 underneath the first offset spacers 18 and the second offset spacers 22. Hence, the source/drain extensions 26 in the p-channel transistors 14 are spaced further from the gate electrodes 16 than the source/drain extensions 20 in the n-channels 12. This accounts for the faster diffusion rates of boron and optimizes the overlap capacitance the p-channel transistors 14. Conventional dosages and implantation energies for the p-type dopants are employed to create the source/drain extensions 26.

Figure 6:
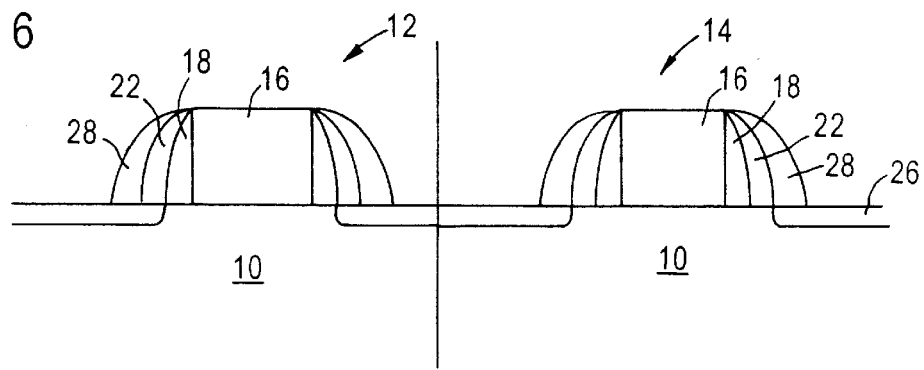
FIG. 6 shows the structure of FIG. 5 after sidewalls spacers have been formed over the n-channel and p-channel transistors, in accordance with embodiments of the present invention.
Figure 7:
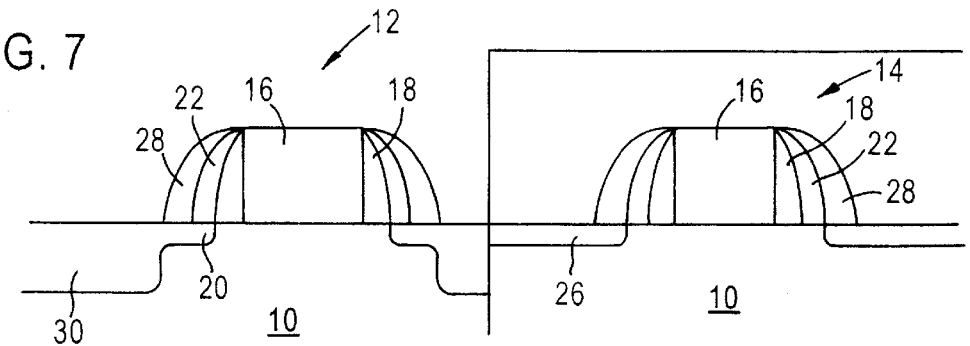
FIG. 7 shows the structure of FIG. 6 after an n-channel source/drain deep implant, in accordance with embodiments of the present invention.

In FIG. 6, sidewall spacers 28 are formed on the second offset spacers 22. The sidewalls spacers 28 are formed on both the n-channel and p-channel transistors 12, 14. The sidewall spacers 28 may be formed of a conventional material, such as silicon oxide, silicon nitride, or silicon oxynitride, for example. A spacer material is deposited and then etched anisotropically to create the sidewall spacers 28. The sidewall spacers 28 are at least twice as large as the first and second offset spacers 18, 22 in preferred embodiments of the invention. Exemplary thicknesses (width) of the sidewall spacers range from about 500 to about 1500 Angstroms in embodiments of the invention. Following the formation of the sidewall spacers 28, in a conventional manner, the p-channel transistors 14 are masked again and a source/drain deep implant is performed to create source/drain regions 30 in the n-channel transistors 12. Conventional dosages and energies may be employed to create the source/drain regions 30. The resulting and structure as depicted in FIG. 7.

Figure 8:
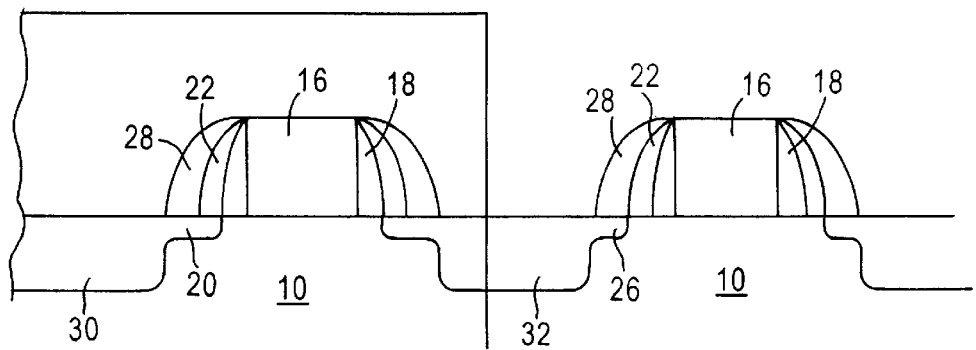
FIG. 8 shows the structure of FIG. 7 after a p-channel source/drain deep implant, in accordance with embodiments of the present invention.

As shown in FIG. 8, a mask is formed over the n-channel transistors 12 and a source/drain deep implant process is performed in a conventional manner to create source/drain regions 32 in the p-channel transistors 14. The sidewall spacers 28 prevent the implantation of the n-type dopants in the substrate directly beneath the spacers 28 during the implantation process of FIG. 7, and the p-type dopants during the implantation process of FIG. 8.

Figure 9:
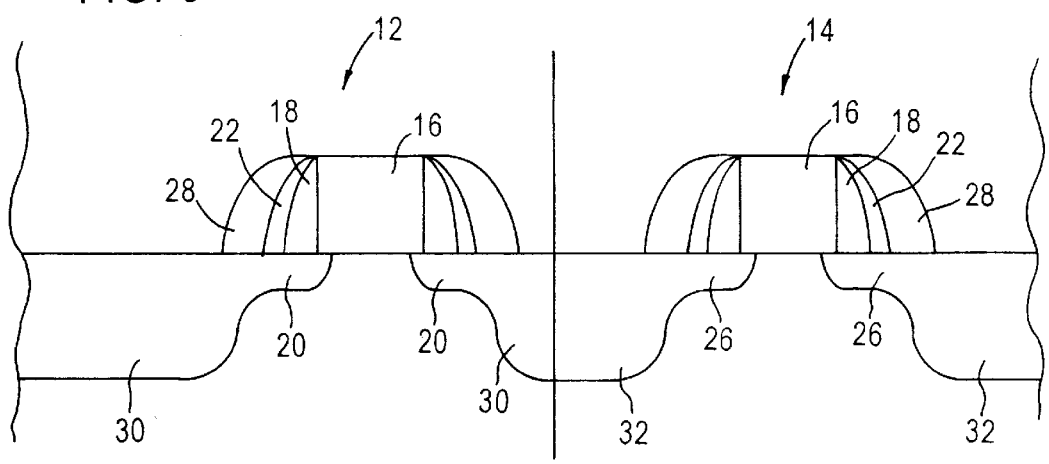
FIG. 9 shows the structure of FIG. 8, depicting the final junction shape.

Following the formation of the source/drain regions 32 in the p-channel transistors 14, the mask over the n-channel transistors 12 is removed. Further processing of the semiconductor device is then performed in accordance with conventional techniques, the result of which is depicted in FIG. 9. Note that the extension junctions have diffused laterally and vertically to form an overlap region with the gate poly.

The present invention provides differential spacing for n-channel and p-channel transistors to create optimum overlap capacitance for the respective transistors. This is achieved in a cost-effective and practical manner by the use of multiple offset spacers formed on the gate electrodes.

In another aspect, the surface of a source/drain is oxidized to create a strain in thin silicon-on-insulator (SOI) film. The source/drain oxidation is performed after a narrow silicon nitride spacer is formed. Therefore, the polysilicon sidewalls are protected during the source/drain oxidation and the transistor structure is unaltered. The strain generated as a result of the source/drain oxidation changes the carrier mobility favorably.

Figure 10:
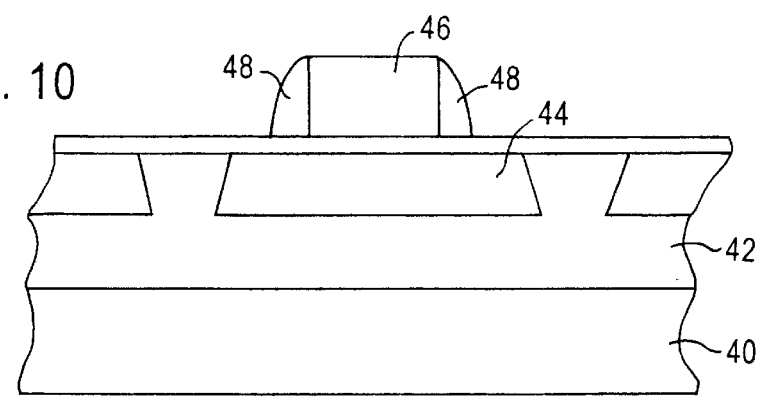
FIG. 10 shows a cross-section of a semiconductor device formation in which strain is generated in an SOI film by source/drain oxidation.

FIG. 10 depicts a precursor in which a silicon substrate 40 is covered by a buried oxide layer 42. SOI islands 44 are formed on the buried oxide layer 42. The gate electrode 46 is protected on its sidewalls by narrow spacers 48, which may be made of silicon nitride, for example.

Figure 11:
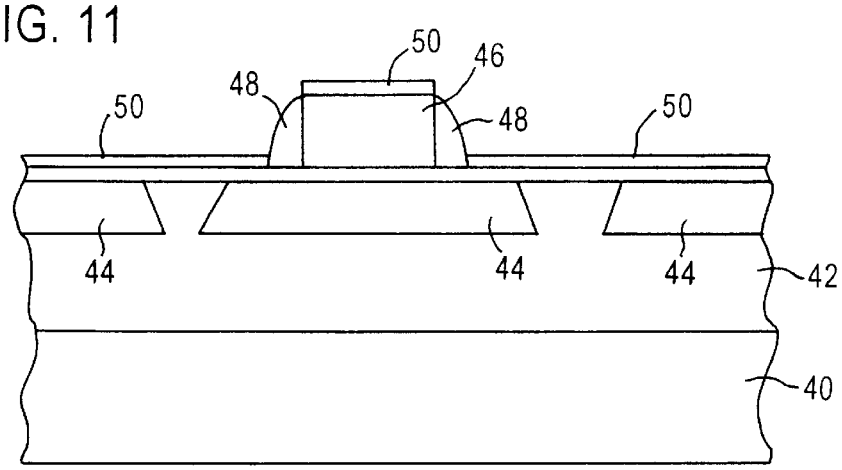
FIG. 11 depicts the structure of FIG. 10 after the oxidation process is completed.

Following the formation of the spacers 48 (by deposition and etch back, for example), an oxidation process is performed to grow oxide 50 over the surface of the source/drain area and the gate electrode 46, as shown in FIG. 11. The growth of the oxide 50 on the surface of the source/drain are causes additional stress to be created in the SOI film 44, thereby improving carrier mobility. A standard CMOS processing may then follow.

Although the present invention has been described and illustrated in detail, it to be clearly understood that the same is by way of illustration and example only, and it is not to be taken by way of limitation, the scope of the present invention being limited only by the terms of the appended claims.

What is claimed is:

1. A method of forming n-channel and p-channel transistors on the same substrate, comprising the steps of:

forming first offset spacers on n-channel transistor gate electrodes and on p-channel gate electrodes, the first offset spacers having a first spacer width;

forming source/drain extensions in the n-channel transistors by implanting n-type dopants spaced from the n-channel gate electrodes by the first spacer width, the first offset spacers masking implantation into the substrate directly beneath the first offset spacers;

forming second offset spacers on the first offset spacers to form offset spacer pairs after the forming of the source/drain extensions in the n-channel transistors, each second offset spacer having a second spacer width, the width of each offset spacer pair being equal to the first spacer width plus the second spacer width; and forming source/drain extensions in the p-channel transistors by implanting p-type dopants spaced from the p-channel gate electrodes by the offset spacer pair width, the first and second offset spacers masking implantation into the substrate directly beneath the first and second offset spacers.

2. The method of claim 1, further comprising forming sidewall spacers on the second offset spacers; forming source/drain regions in the n-channel transistors by implanting n-type dopants; and forming source/drain regions in the p-channel transistors by implanting p-type dopants.

3. The method of claim 2, wherein the first offset spacer has a width between about 60 Å to about 180Å.

4. The method of claim 3, wherein the second offset spacer has a width between about 120 Å to about 240Å.

5. The method of claim 1, further comprising forming a liner oxide on the gate electrode, the first offset spacers and the substrate after the source/drain extensions in the n-channel transistors are formed and prior to the forming of the second offset spacers.

* * * * *